US007923783B2

(12) United States Patent
Abe

(10) Patent No.: US 7,923,783 B2
(45) Date of Patent: Apr. 12, 2011

(54) SEMICONDUCTOR MEMORY DEVICE HAVING RESISTANCE ELEMENT WITH TWO CONDUCTORS

(75) Inventor: Takumi Abe, Mountain View, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/408,287

(22) Filed: Mar. 20, 2009

(65) Prior Publication Data
US 2009/0236652 A1 Sep. 24, 2009

(30) Foreign Application Priority Data

Mar. 21, 2008 (JP) ................................ 2008-073523

(51) Int. Cl.
| | |
|---|---|
| H01L 27/01 | (2006.01) |
| H01L 27/12 | (2006.01) |
| H01L 31/0392 | (2006.01) |
| H01L 27/10 | (2006.01) |
| H01L 29/74 | (2006.01) |
| H01L 23/62 | (2006.01) |
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |
| H01L 29/00 | (2006.01) |
| H01L 27/082 | (2006.01) |
| H01L 27/102 | (2006.01) |
| H01L 29/70 | (2006.01) |
| H01L 31/11 | (2006.01) |
| H01L 23/48 | (2006.01) |

(52) U.S. Cl. ......... 257/350; 257/211; 257/358; 257/360; 257/363; 257/379; 257/380; 257/381; 257/516; 257/533; 257/536; 257/543; 257/577; 257/758; 257/904; 257/E27.047; 257/E27.071; 257/E27.101; 257/E29.176; 257/E27.016; 257/E27.033; 257/E27.035

(58) Field of Classification Search .................. 257/211, 257/350, 577, 758, 358, 360, 363, 379–381, 257/516, 533, 536, 543, 904, E27.047, E27.071, 257/E27.101, E27.176, E27.016, E27.033, 257/E27.035
See application file for complete search history.

(56) References Cited

U.S. PATENT DOCUMENTS

| | | | | |
|---|---|---|---|---|
| 5,489,547 A | * | 2/1996 | Erdeljac et al. | ............... 438/238 |
| 6,218,729 B1 | * | 4/2001 | Zavrel et al. | ................... 257/698 |
| 6,635,937 B2 | * | 10/2003 | Ootsuka et al. | ............... 257/379 |
| 6,667,507 B2 | * | 12/2003 | Shirota et al. | ................. 257/315 |
| 6,759,729 B1 | * | 7/2004 | Racanelli et al. | ............. 257/536 |

(Continued)

FOREIGN PATENT DOCUMENTS

JP     2003-100888     4/2003

(Continued)

*Primary Examiner* — Ida M Soward
(74) *Attorney, Agent, or Firm* — Oblon, Spivak, McClelland, Maier & Neustadt, L.L.P.

(57) ABSTRACT

A semiconductor memory device according to an embodiment of the present invention includes a resistance element which is constructed with a first conductor which extends in a first direction and is connected to a first contact; a second conductor which extends in said first direction and is connected to a second contact; and a first insulation film which exists between said first conductor and said second conductor, said first insulation film also having an opening in which a third conductor which connects said first conductor and said second conductor is arranged.

27 Claims, 15 Drawing Sheets

U.S. PATENT DOCUMENTS

| | | | |
|---|---|---|---|
| 6,921,960 B2* | 7/2005 | Ichige et al. | 257/532 |
| 7,180,120 B2* | 2/2007 | Won | 257/306 |
| 7,217,981 B2* | 5/2007 | Coolbaugh et al. | 257/380 |
| 7,288,799 B2* | 10/2007 | Saigoh et al. | 257/127 |
| 7,298,020 B2* | 11/2007 | Asano et al. | 257/536 |
| 7,485,915 B2* | 2/2009 | Nasu et al. | 257/310 |
| 7,518,173 B2* | 4/2009 | Hikosaka et al. | 257/295 |
| 7,592,660 B2* | 9/2009 | Nagai et al. | 257/306 |
| 7,605,418 B2* | 10/2009 | Song | 257/296 |
| 7,732,895 B2* | 6/2010 | Toda | 257/533 |
| 2002/0149082 A1* | 10/2002 | Nagano et al. | 257/516 |
| 2005/0161723 A1* | 7/2005 | Higuchi | 257/301 |
| 2005/0269663 A1* | 12/2005 | Minami et al. | 257/510 |
| 2006/0220003 A1 | 10/2006 | Noguchi et al. | 257/22 |
| 2007/0152295 A1* | 7/2007 | Yeh et al. | 257/516 |
| 2008/0135910 A1* | 6/2008 | Youn | 257/311 |
| 2008/0258195 A1* | 10/2008 | Sugawara et al. | 257/295 |
| 2008/0258262 A1* | 10/2008 | Nagai | 257/535 |
| 2009/0298203 A1* | 12/2009 | Nagai | 438/3 |
| 2010/0019348 A1* | 1/2010 | Nagai | 257/532 |
| 2010/0084702 A1 | 4/2010 | Fukuda et al. | |

FOREIGN PATENT DOCUMENTS

JP    2006-269504    10/2006

* cited by examiner (a)

MEMORY CELL REGION | PERIPHERAL CIRCUIT REGION (b)

(a)

(b)

SEMICONDUCTOR MEMORY DEVICE HAVING RESISTANCE ELEMENT WITH TWO CONDUCTORS

CROSS REFERENCE TO RELATED APPLICATION

This application is based upon and claims the benefit of priority from the prior Japanese Patent Application No. 2008-073523, filed on Mar. 21, 2008, the entire contents of which are incorporated herein by reference.

BACKGROUND OF THE INVENTION

1. Field of the Invention

The present invention is related to a semiconductor memory device.

2. Description of the Related Art

A semiconductor memory device which is manufactured using a semiconductor includes a region in which memory elements are arranged and a region in which peripheral circuits are arranged. Also, most of the region in which peripheral circuits are arranged is taken up with analog circuits. In an analog circuit, resistance elements are used. Resistance elements are, for example, arranged being concentrated around input terminals of signals, which are externally input.

In addition, within a semiconductor memory device which comprises a NAND type flash memory, highly accurate resistance elements are required in a limiter circuit, for example, for accurately converting a high voltage generated by a charge pump circuit to a predetermined voltage. In addition, an RC delay circuit which is one type of analog circuit is comprised using resistance elements and highly accurate resistance elements are also required for an RC delay circuit.

The resistance elements of a semiconductor memory device are formed by a semiconductor formation process. For example, a technology for changing the resistance value of a resistance element is disclosed in Japan Laid Open Patent 2006-269504, in which a plurality of contacts separated by equal intervals along the length of a resistance element are formed and a wiring pattern which is connected with one of the contacts and the value of the resistance element is changed thereby.

BRIEF SUMMARY OF THE INVENTION

As one embodiment of the present invention, a semiconductor memory device is proposed comprising a resistance element including: a first conductor which extends in a first direction and is connected to a first contact; a second conductor which extends in said first direction and is connected to a second contact; and a first insulation film which exists between said first conductor and said second conductor, said first insulation film also having and opening in which a third conductor which connects said first conductor and said second conductor is arranged.

As another embodiment of the present invention, a semiconductor memory device is proposed comprising a resistance element including: a first insulation film; a first conductor which is formed above said first insulation film, said first conductor extending in a first direction; a second insulation film which is formed above said first conductor; a first opening which passes through said second insulation film, said first opening being formed from a conducting material; a second conductor which is formed above said second insulation film, said second conductor extending in said first direction and being electrically connected with said first conductor by said conducting material of said first opening; a third insulation film which is formed above said second conductor; a first contact which passes through said third insulation film and said second insulation film, said first contact being connected with said first conductor, said first contact being electrically connected with said second conductor via said conducting material of said first opening; and a second contact which passes through said third insulation film, said second contact being connected to said second conductor.

As still another embodiment of the present invention, a method of manufacturing a semiconductor memory device comprising a resistance element is proposed comprising: forming a first conductor, said first conductor being extended in a first direction above a first insulation film; forming a second insulation film above said first conductor, said second insulation film having a first opening; filling a conducting material into said first opening; forming a second conductor, said second conductor extending in said first direction above said second insulation film, said second conductor being connected electrically to said first conductor by said conducting material filled into said first opening; forming a third insulation film above said second conductor; forming a first contact which passes through said third insulation film and said second insulation film, said first contact being connected with said first conductor, said first contact conducting with said second conductor via said first opening; and forming a second contact which passes through said third insulation film, said second contact being connected electrically to said second conductor.

DETAILED DESCRIPTION OF THE INVENTION

Figure 1:
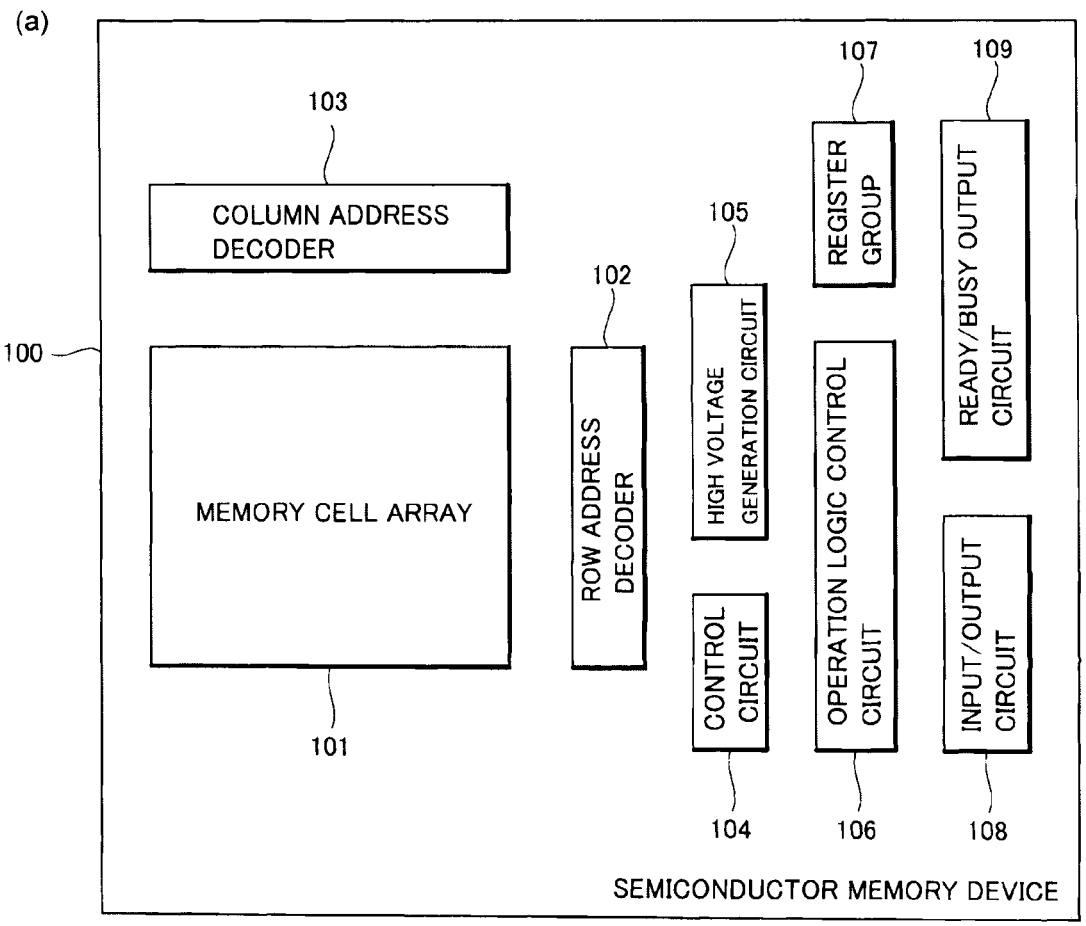
FIG. 1(a) is a functional block diagram of a semiconductor memory device related to a first embodiment of the present invention.
FIG. 1(b) is an equivalent circuit diagram of a memory cell array 101 in which memory elements are arranged in a NAND structure.
Figure 1:
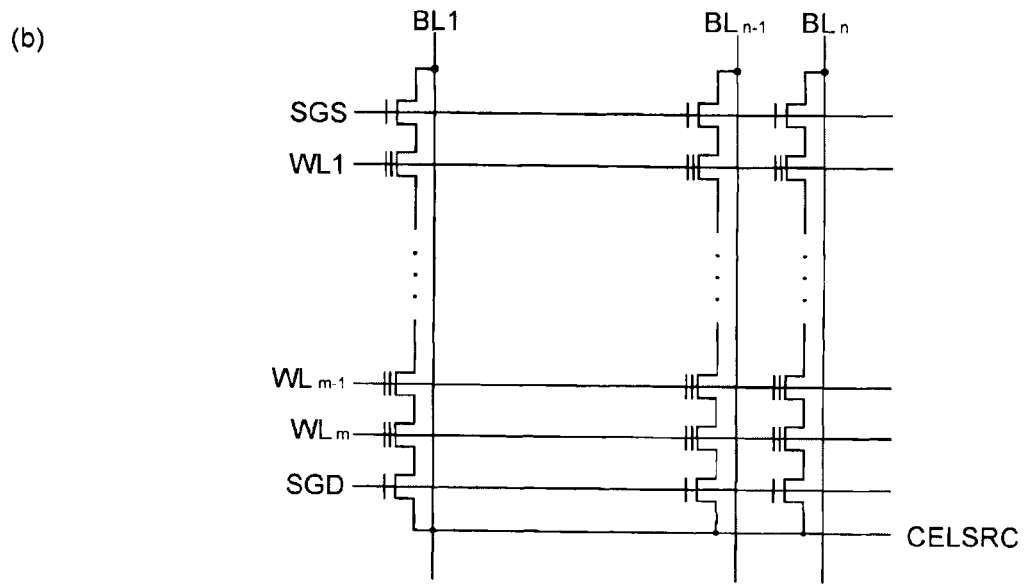

Embodiments of the present invention are explained below while referring to the drawings. Furthermore, the same numerals are sometimes attached to those parts in the drawings which may be made from the same material. In addition, the drawings are typically shown for ease of explanation and therefore the relationship between thickness and plane dimensions or the thickness ratio of each film may be different from the actual parts. In addition, each embodiments of the present invention explained below is shown as one example and the present invention may be realized by various changes which do not deviate from the spirit of the present invention.

FIG. 1(a) shows a functional block diagram of the semiconductor memory device related to a first embodiment of the present invention. This semiconductor memory device 100 is arranged with a memory cell array 101, a row address decoder 102, a column address decoder 103, a control circuit 104, a high voltage generation circuit 105, an operation logic controller circuit 106, a register group 107, an input/output circuit 108, and a ready/busy output circuit 109.

The memory cell array 101 is arranged with memory elements. As an example of the arrangement of the memory cells, there is a NAND type arrangement which includes a plurality of cell units in which memory elements are arranged in series. As an example of a memory element, there is a memory element having a MISFET (Metal Insulator Semiconductor Field Effect Transistor) structure in which a charge accumulation layer (for example, a floating gate or ONO layer) and a control gate are stacked above a semiconductor substrate.

FIG. 1(b) shows an equivalent circuit diagram of a memory cell array 101 in which memory elements are arranged in a NAND structure. A cell unit is connected to each bit line BL1, . . . BLn−1, and BLn. In each cell unit, m memory elements are connected in series between a drain side select transistor, which is connected to a bit line, and a source side select transistor, which is connected to a common source line CELSRC. The gate electrode of the drain side select transistor of each cell unit is connected to a drain side selection gate line SGD. The gate electrode of the source side select transistor of each cell unit is connected to a source side selection gate line SGS. The control gate of each memory element is connected to one of the word lines WL1, . . . , WLm−1, and WLm.

The row address decoder 102 is a control circuit for controlling the potential of the SGS line, the word lines, the SGD line. The column address decoder 103 controls the potential of the bit lines. In addition, the column address decoder 103 is arranged with sense amplifiers, each of which senses the potential of a bit line. The control circuit 104 controls each part of the semiconductor memory device according to an instruction input from outside of the semiconductor memory device. The high voltage generation circuit 105 generates various voltages which are applied to the SGS line, the word lines, the SGD line, and bit lines. The operation logic control circuit 106 is constructed by a sequencer which decides a control sequence of the control circuit 104. The register group 107 is comprised of a plurality of registers such as an address register which stores an address of a memory cell to be programmed, read, and erased, a data register for storing data to be programmed into memory cells or data read from memory cells, and a status register for storing a variety of statuses. The input/output circuit 108 performs input and output of addresses and data with an external host device. The ready/busy output circuit 109 externally outputs a ready/busy status signal which shows whether the semiconductor memory device can receive external data.

Generally, in a semiconductor memory device, a region in which memory elements are arranged and all other regions are distinguished. The former is called a memory cell region and the latter are called peripheral circuit regions.

FIG. 2(a) shows a planar cross sectional view of the semiconductor memory device related to a first embodiment of the present invention. The planar cross sectional view shown in FIG. 2(a) is parallel to a semiconductor substrate surface and includes a planar view of word lines. A planar cross sectional view of the memory cell region is shown on the left side of the planar cross sectional view shown in FIG. 2(a) and the planar cross sectional view of a periphery circuit region is shown on the right side. In particular, contacts 22 and 23, which reach resistance elements 13, 20, are shown in the planar cross sectional view of the periphery circuit region.

Word lines 20 are shown in the planar cross section of the memory cell region. The arrangements of floating gates 13, which are located on a layer below the word lines 20, are shown by dotted lines. In addition, first conductors 13 which are connected to the contacts 22 are shown by long dotted lines in the planar cross section of the periphery circuit region. The first conductors 13 extend in a first direction. In addition, second conductors 20 which are connected to the contacts 23 are shown by short dotted lines. The second conductors 20 also extend in the first direction in FIG. 2(a). However, the second conductors 20 need not extend in the first direction. In addition, first openings 19 each of which passes through a first conductor 13 and a second conductor 20 are shown by dotted lines. When looking from a perpendicular direction to the semiconductor substrate as in FIG. 2(a), the first conductors 13 and the second conductors 20 overlap in regions other than the first openings 19.

Furthermore, a reference numeral 13 is used for both a floating gate and a first conductor. It shows that the material of a floating gate and the material of a first conductor may be the same material. In addition, this also indicates that a floating gate and a first conductor may be formed at the same time. In addition, the material of a floating gate and the material of a first conductor may also be different or a floating gate and a first conductor may be formed at different times.

FIG. 2(b) shows a cross-section view taken along a cutting-plane line A-A in FIG. 2(a) of the semiconductor memory device related to the first embodiment of the present invention. A memory cell region and a peripheral circuit region are formed above the semiconductor substrate 10 and separated by isolation parts 16 and 17. A first insulation film 12 is formed above the semiconductor substrate 10 and a first conductor 13 is formed above the first insulation film 12 in the peripheral circuit region. A fourth insulation film 11 is formed above the semiconductor substrate 10 and a floating gate 13 is formed above the fourth insulation film 11 in the memory cell region.

Here, the material of the first insulation film 12 and the material of the fourth insulation film 11 may be the same. For example, $SiO_2$ or SiON may be used. In addition, the first insulation film 12 and the fourth insulation film 14 may be formed at the same time. Also, the thickness of the first insulation film 12 and the thickness of the fourth insulation film 11 may be the same. However, a tunnel current flows through the fourth insulation film 11. Due to this, it is preferable that a tunnel current does not flow through the first insulation film 12. Thus, it is preferred that the first insulation film 12 be formed thicker than the fourth insulation film 11. In addition, the first insulation film 12 and the fourth insulation film 11 may be formed from different materials and at different times. For example, even if the same material is used, the film thickness of the first insulation film 12 is made 13 nm or more and the film thickness of the fourth insulation film 11 is made from 4 nm to 12 nm. As a result of this, even if a potential difference becomes 5V or more between the semiconductor substrate 10 and the first conductor 13 separated by the first insulation film 12, it is possible to prevent the generation of a tunnel current.

It is possible to use a conducting material such as polysilicon or silicon-germanium, for example, for both the first conductor 13 and the floating gate 13. The first conductor 13 and the floating gate 13 are formed by depositing one of such materials to a thickness from 20 nm to 200 nm. In addition, the material of the first conductor 13 and the floating gate 13 may be different. In addition, the first conductor 13 and the floating gate 13 may be formed at different times. A charge accumulation layer may be formed instead of the floating gate from a nitride film for example.

The second insulation film 14 which includes the first opening 19 is formed above the first conductor 13 in the peripheral circuit region. The second insulation film 14 is formed from SiON or $SiO_2$ to a thickness from 20 nm to 300 nm for example. The position of the first opening 19 is determined according to a preferable resistance value between the second contact 22 and the first contact 23. The isolation part 17 and the floating gate 13 are covered by a fifth insulation film 18 in the memory cell region. The fifth insulation film 18 may be formed at the same time as and from the same material as the second insulation film 14. In addition, the fifth insulation film 18 may be formed form a different material to the second insulation film 14 and may also be formed at a different time to the second insulation film 14.

The second conductor 20 is formed above the second insulation film 14 in the peripheral circuit region. The second conductor 20 is electrically connected to the first conductor 13 via the first opening 19. In addition, a fifth conductor 20 which becomes a control gate electrode and a word line for example, is formed above the fifth insulation film 18 in the memory cell region. The second conductor 20 and the fifth conductor 20 are formed, for example, by depositing polysilicon added with a high concentration of impurities to a thickness from 10 nm to 30 nm. In addition, the fifth conductor 20 may be comprised of a plurality of layers. In this case, the lower layers at the side of the fifth insulation film 18 may be a polysilicon layer added with a high concentration of impurities and the higher layers may be a metal film. For example, metals such as tungsten-silicide, gold-silicide, nickel-silicide, tungsten or aluminum can be mainly used as the material for the metal film. In addition, because the first conductor 13 acts as a floating gate and the second conductor 20 acts as a control gate electrode, generally, the materials of the first conductor 13 and the second conductor 20 are different. As a result, generally, the resistance value per unit length of the first conductor 13 and the resistance value per unit length of the second conductor 20 are different. In addition, as will be shown below, the resistance value per unit length of the first conductor 13 and the resistance value per unit length of the second conductor 20 may sometimes be the same.

Then, an interlayer insulation film 21 (third insulation film) is deposited above the second conductor 20 and the fifth conductor 20. For example, $SiO_2$ or a silicate glass such as BPSG, BSG, and PSG is deposited. Alternatively, HSQ, MSQ or a low dielectric insulation film such as SiLK is deposited. The first contact 23 and the second contact 22 are arranged in the interlayer insulation film 21 in the peripheral circuit region. The first contact 23 passes through the interlayer insulation film 21 and reaches the second conductor 20 so that the first contact 23 and the second conductor 20 are connected electrically. The second contact 22, however, passes through the interlayer insulation film 21 and the second insulation film 14 and reaches the first conductor 13 so that the second contact 22 and the first conductor 13 are connected electrically. Here, the second contact 22 is not directly connected electrically to the second conductor 20 but indirectly connected electrically to it via the first conductor 13 and the first opening 19. In addition, the first contact 23 is electrically connected to the second conductor 20 via the first conductor 13 and the first opening 19. Therefore, the electrical resistance between the first contact 23 and the second contact 22 is mainly determined by the electrical resistance which occurs between the first conductor 13 and the second conductor 20 which are connected electrically via the first opening 19. That is, the electrical resistance is dependent on the position of the first opening 19.

Figure 2:
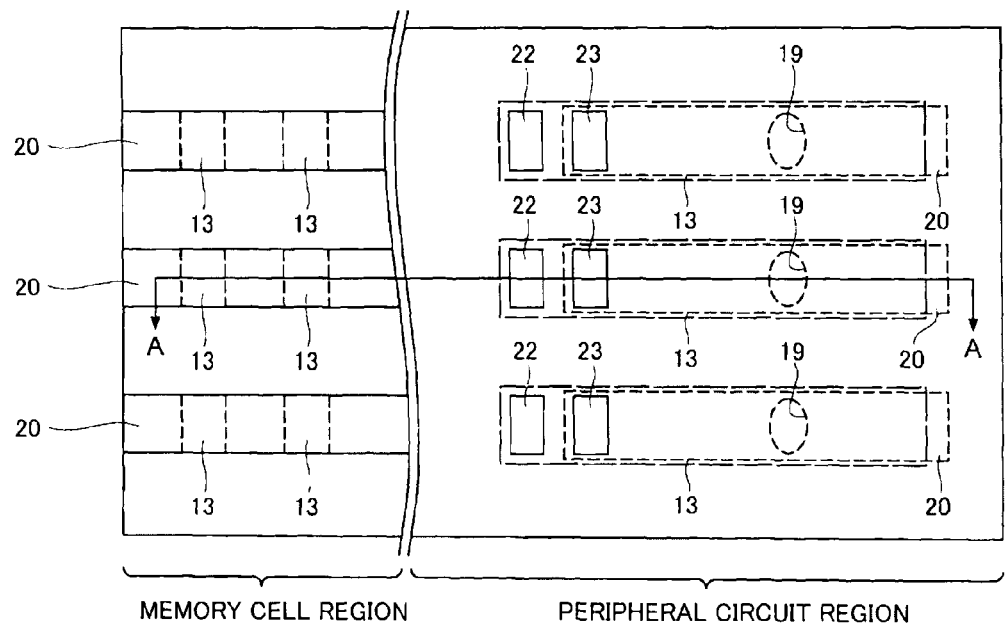
FIG. 2(a) is a planar cross sectional view of the semiconductor memory device related to a first embodiment of the present invention.
FIG. 2(b) is a cross-sectional view taken along a cutting-plane line A-A in FIG. 2(a).
Figure 2:
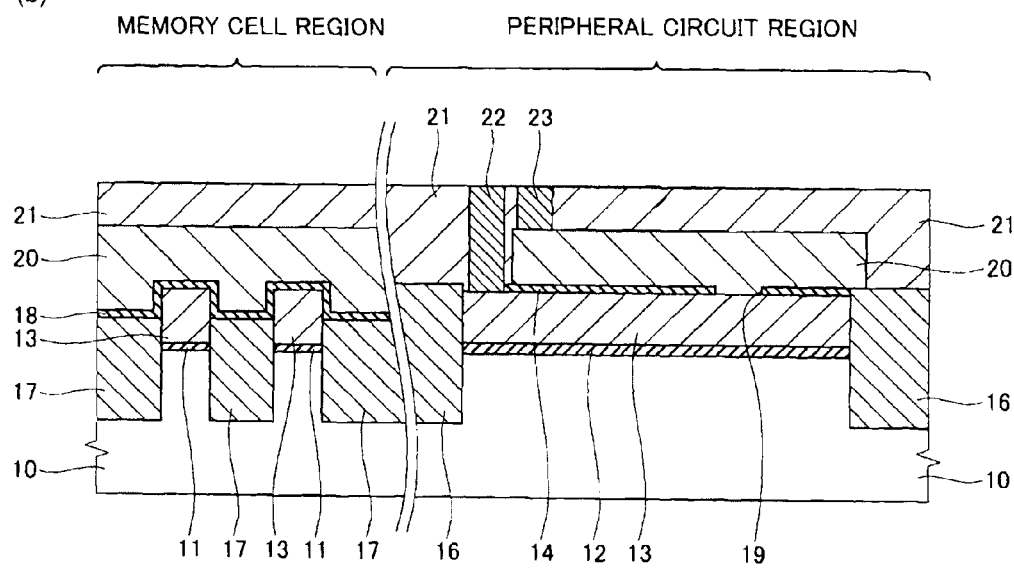
Figure 3:
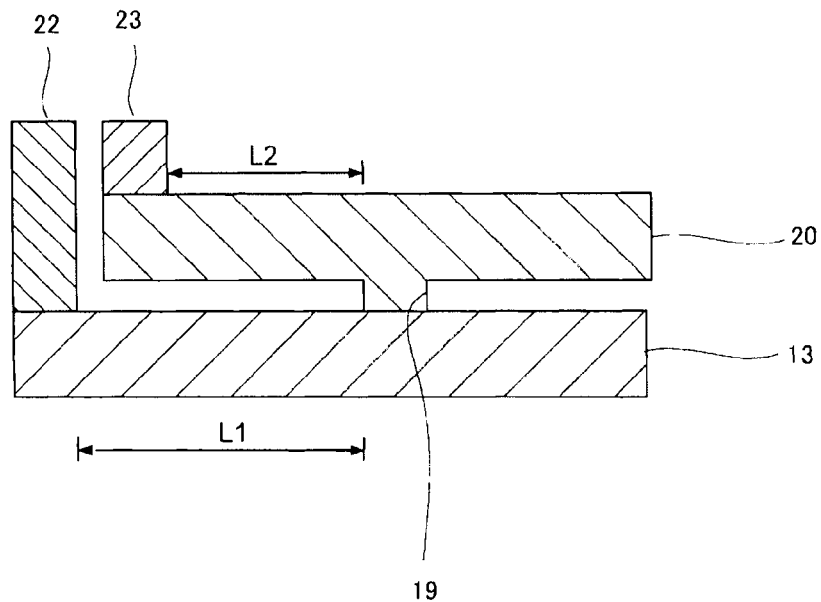
FIG. 3(a) is cross-sectional view of a resistance element in the semiconductor memory device related to a first embodiment of the present invention.
FIG. 3(b) is cross-sectional view of a resistance element in the semiconductor memory device related to a first embodiment of the present invention.
Figure 3:
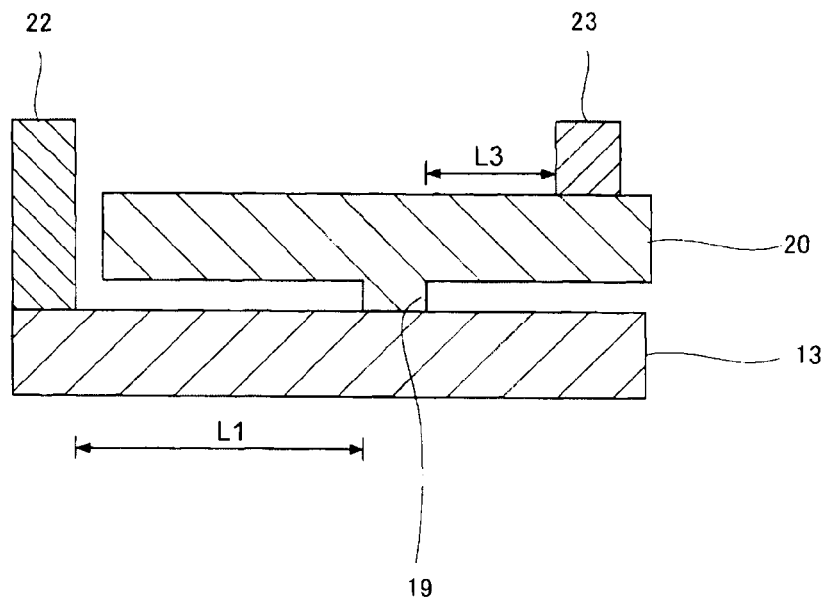

FIG. 3(a) is cross-sectional view which shows FIG. 2(b) after removing the first conductor 13, the first opening 19, the second conductor 20, the first contact 23 and the second contact 22. The length from the second contact 22 to the first opening 19 is denoted by L1 and the length from the first contact 23 to the first opening 19 is denoted by L2. In addition, let us assume that the resistance value per unit length of the first conductor 13 is ρ1 and that the resistance value per unit length of the second conductor 20 is ρ2. Then, the electrical resistance between the first contact 23 and the second contact 22 becomes ρ1×L1+ρ2×L2. Therefore, let us further assume that the values of L1 and L2 are decided by completion of design and that after the position of the first opening 19 is decided the resistance values per unit length ρ1 and ρ2 are changed to different values because of a change in design such as the material characteristics of the first conductor 13 or second conductor 20. In this case, the values of L1 and L2 are changed if the position of the first opening 19 is changed according to this change it is possible to maintain the initial designed electrical resistance between the first contact 23 and the second contact 22. In this case, it is not necessary to change the positions of the first contact 23 and the second contact 22. As a result, there is no change in the wiring to the first contact 23 and the second contact 22.

Specifically, in the case where ρ1 and ρ2 are respectively changed to ρ1' and ρ2', the movement distance of the first opening 19 to the left becomes {L1×(ρ1'−ρ1)+L2×(ρ2'−ρ2)}/(ρ1'+ρ2'). If this value is more than both L1 and L2 and less than or equal to the length of the first conductor, a design change of the first conductor 13 and the second conductor 20 is not required. As a result, there is no change in the wiring to the first contact 23 and the second contact 22.

In FIG. 2(b), the first contact 23 and the second contact 22 are arranged so that they are adjacent. That is, the first opening exists on an opposite side of the second contact 22 with respect to a part of the first conductor, which is a common part of the first conductor 20 and the first contact 23 if the first contact 23 is extended toward the first conductor 20. However, the present invention is not limited to this. For example, as is shown in FIG. 3(b) the first contact 23 and the second contact 22 are arranged further apart than shown in FIG. 2(b) and the first opening 19 may be located between them. In this case, the electrical resistance between the first contact 23 and the second contact 22 become $\rho1 \times L1 + \rho2 \times L2$. In this case, the value of L1+L2 become fixed without depending on the position of the first opening 19. However, generally, because the materials of the first conductor 13 and the second conductor 20 are different, $\rho1$ and $\rho2$ are not the same. As a result, even if the value of L1+L2 is fixed, by changing the values of L1 and L2, that is, changing the position of the first opening 19, it is possible to change the electrical resistance between the first contact 23 and the second contact 22.

Specifically, in the case where $\rho1$ and $\rho2$ are respectively changed to $\rho1'$ and $\rho2'$, the movement distance of the first opening 19 to the left becomes $\{L1 \times (\rho1-\rho1') + L2 \times (\rho2-\rho2')\}/(\rho1'+\rho2')$. If this value is less than or equal to L1 and more than or equal to −L2, a design change of one or two positions of the first conductor 13 and the second conductor 20 is not required. As a result, there is no change in the wiring to the first contact 23 and the second contact 22.

One example of the manufacturing process of the semiconductor memory device shown in FIG. 2 is explained below while referring to FIG. 4 to FIG. 12.

Figure 4:
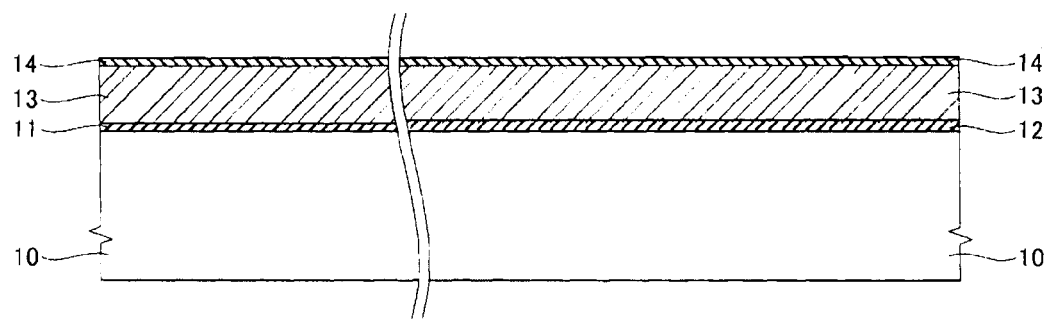
FIG. 4 is a diagram which shows a process of the semiconductor memory device related to a first embodiment of the present invention.

As is shown in FIG. 4, the first insulation film 12 and the fourth insulation film 11 are formed above the semiconductor substrate 10. Then, the material of the conductor 13 and the floating gate 13 is deposited above the first insulation film 12 and the fourth insulation film 11, and the second insulation film 14 is formed above this material. A material which acts as a stopper of CMP (Chemical Mechanical Polishing), which is subsequently performed, can be used as the material of the second insulation film 14.

In addition, boron at $10^{16}$ cm$^{-3}$ surface concentration may be added in the peripheral circuit region among the parts of the semiconductor substrate 10. As a result, it is possible to increase the inversion threshold of the semiconductor substrate 10 and then it is possible to reduce parasitic capacitance of the first conductor 13 to the substrate. In particular, it is possible to control an increase in CR delay which is the cause of parasitic capacitance.

Figure 5:
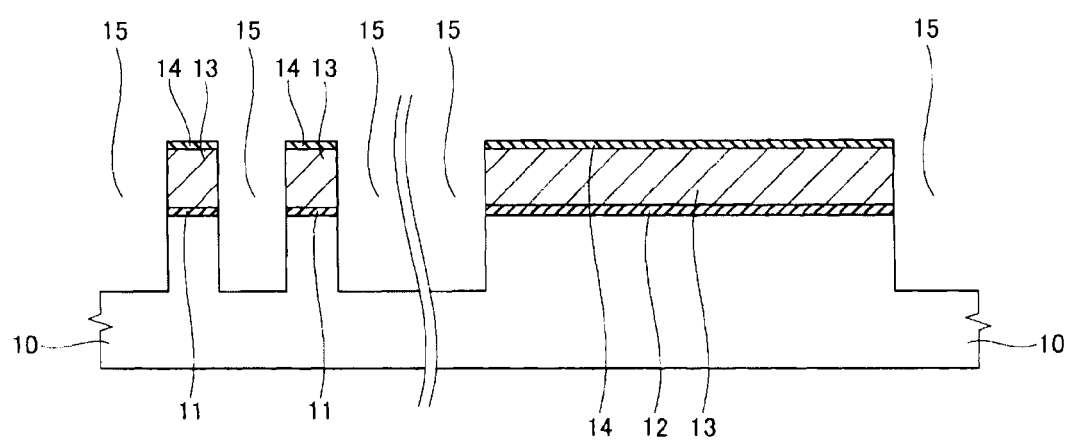
FIG. 5 is a diagram which shows a process of the semiconductor memory device related to a first embodiment of the present invention.
Figure 6:
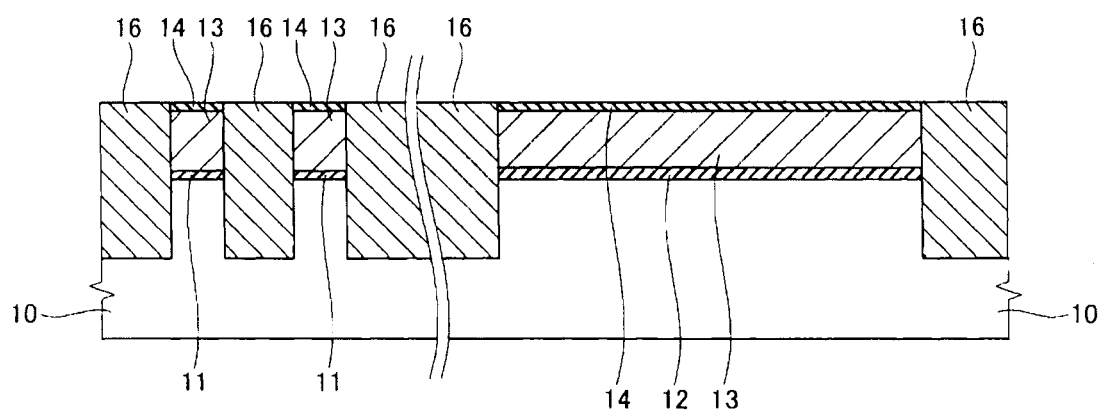
FIG. 6 is a diagram which shows a process of the semiconductor memory device related to a first embodiment of the present invention.

A photo-resist is coated above the second insulation film 14 and a trench pattern is formed by photolithography for forming the isolation parts 16 and 17. Etching is then performed using this pattern. Then, as is shown in FIG. 5, the trenches 15 are obtained. Then, after oxidizing the inner sides of the trenches 15 according to necessity, SiO2 is deposited by a method such as a HDP (high Density Plasma) method or HTO (High Temperature Oxide) method, or deposition using a film such as polysilazane which can be converted to $SiO_2$, is performed in order to fill the trenches 15. Following this, CMP is performed and planarization is carried out. As a result, the structure in FIG. 6 is obtained.

Figure 7:
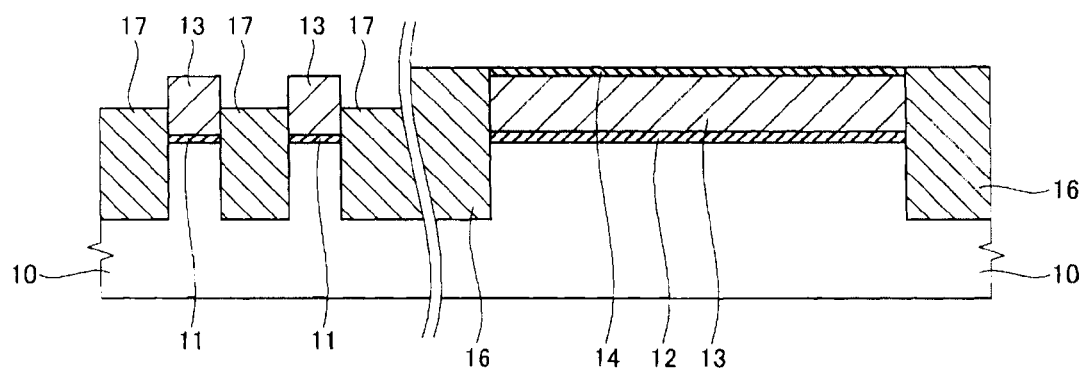
FIG. 7 is a diagram which shows a process of the semiconductor memory device related to a first embodiment of the present invention.

Following this, as is shown in FIG. 7, the tops of isolation parts 17 of the memory cell region are removed by etching. As a result, it is possible to increase the area of the floating gate 13 which contacts with a control gate via the fifth insulation film 18 which is subsequently introduced. Consequently, even if a film with a low dielectric strength voltage is used as the fifth insulation film 18, it is possible to increase reliability.

In addition, the second insulation film 14 of the memory cell region is stripped before or after the formation of isolation parts 17.

Figure 8:
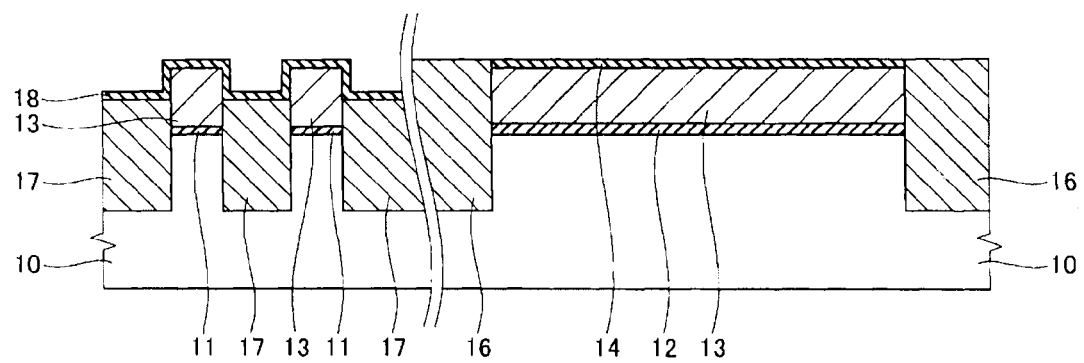
FIG. 8 is a diagram which shows a process of the semiconductor memory device related to a first embodiment of the present invention.
Figure 9:
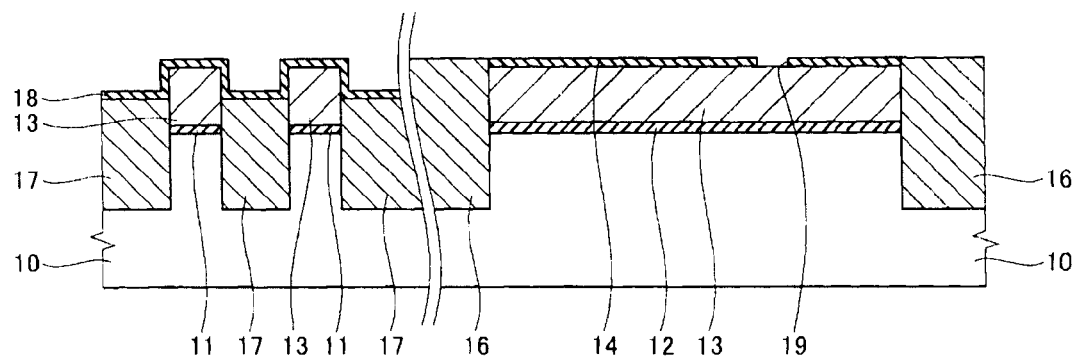
FIG. 9 is a diagram which shows a process of the semiconductor memory device related to a first embodiment of the present invention.

Next, as is shown in FIG. 8, the memory cell region is covered by the fifth insulation film 18. In addition, as is shown in FIG. 9, the first opening 19 is arranged on the second insulation film 14 of the peripheral circuit region. The position of the first opening 19 is determined with consideration for the resistance values per unit length between the first conductor 13 and the second conductor 20 and also the positions of the contacts 22 and 23. Furthermore, covering the memory cell region with the fifth insulation film 18 may be performed before or after arranging the first opening 19.

Furthermore, after covering the memory cell region with the fifth insulation film 18, the floating gates are separated and a process for forming a diffusion region is performed.

Figure 10:
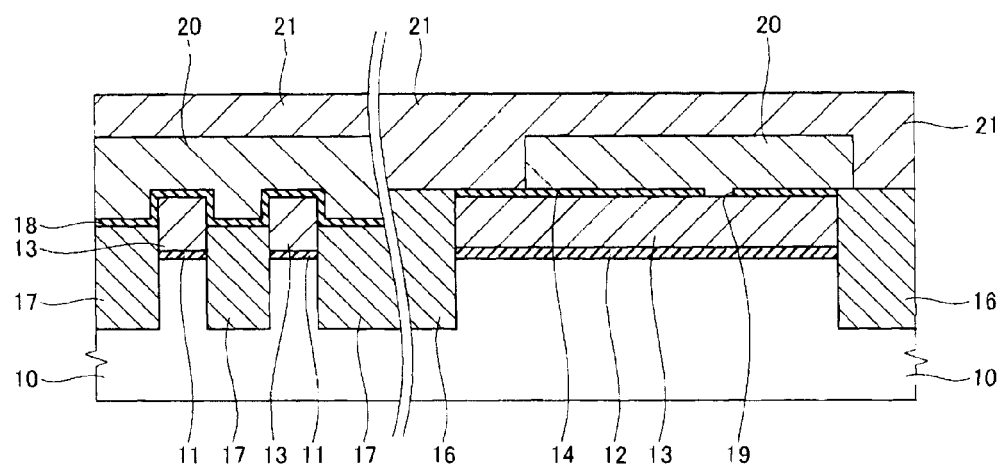
FIG. 10 is a diagram which shows a process of the semiconductor memory device related to a first embodiment of the present invention.

After this, a conducting film 20 is deposited above the fifth insulation film 18 of the memory cell region and above the second insulation film 14 of the peripheral circuit region. This conducting film 20 becomes control gates in the memory cell region and one part of the resistance element in the peripheral circuit region. Also, according to necessity, a metal film which functions as a word line may be formed above the conducting film 20 which is deposited in the memory cell region. After this, processing is performed by lithography and etching and the second conductor 20 and the fifth conductor 20 are formed in the peripheral circuit region and the memory cell region respectively as shown in FIG. 10. Then, an interlayer insulation film 21 is formed above this.

Then, from above the interlayer insulation film 21, the first contact 23 which conducts to the second conductor 20 and the second contact 22 which conducts to the first conductor 13 are formed. As a result, the structure in FIG. 2 (b) is obtained.

Figure 11:
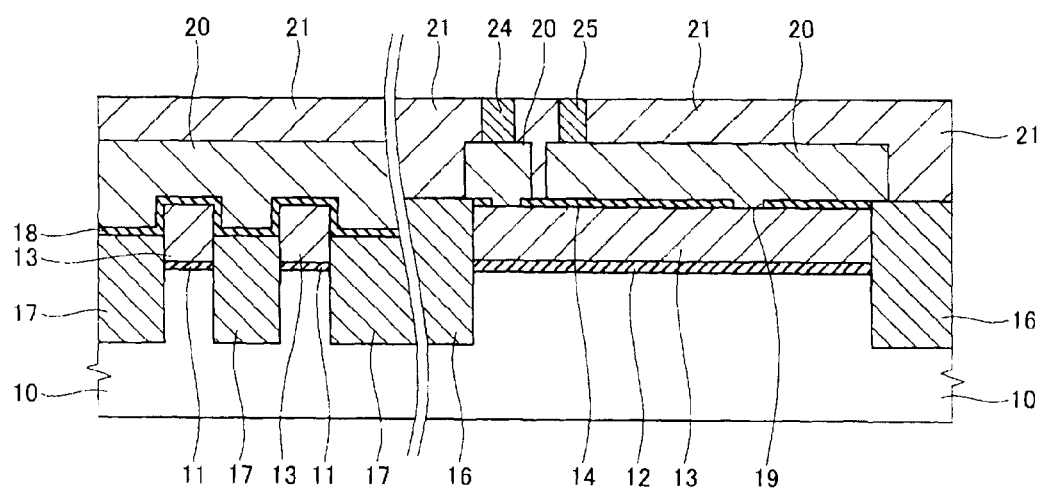
FIG. 11 is planar cross sectional diagram of the semiconductor memory device related to a first embodiment of the present invention.

Furthermore, in FIG. 10, the second conductor 20 is shown as if it does not cover the first conductor 13. This is because the second contact 22 is arranged on the upper part of the left end of the first conductor 13 so that the second contact 22 is not directly connected electrically to the second conductor 20. However, the present invention is not limited to this. For example, in FIG. 9, the first opening 19 is arranged in the second insulation film 14 and a second opening is also arranged on the upper part of the left side of the first conductor 13. Then, a conducting film 20 is deposited, processing of the second conductor 20 is performed by lithography and etching in the peripheral circuit region as shown in FIG. 11, and a part which conducts with the first opening 19 and a part which conducts with the second opening are separated. In this way, it is possible to make the first conductor 13 and the second conductor 20 conduct via the first opening 19 but not via the second opening. Then, contacts 24 and 25 may be arranged on each of the conductors which have separated.

Alternatively, instead of separating the part which conducts with the first opening and the part which conducts with the second opening, after arranging an opening in the second conductor 20 for forming the contact 24, the entire inside of this opening may be covered by an insulation film. In this way, it is possible to electrically connect the contact 24 and the second conductor 20 although they do not directly conduct. This means that the contact 24 conducts with the second conductor 20 via the first conductor 13 and the first opening 19.

Figure 12:
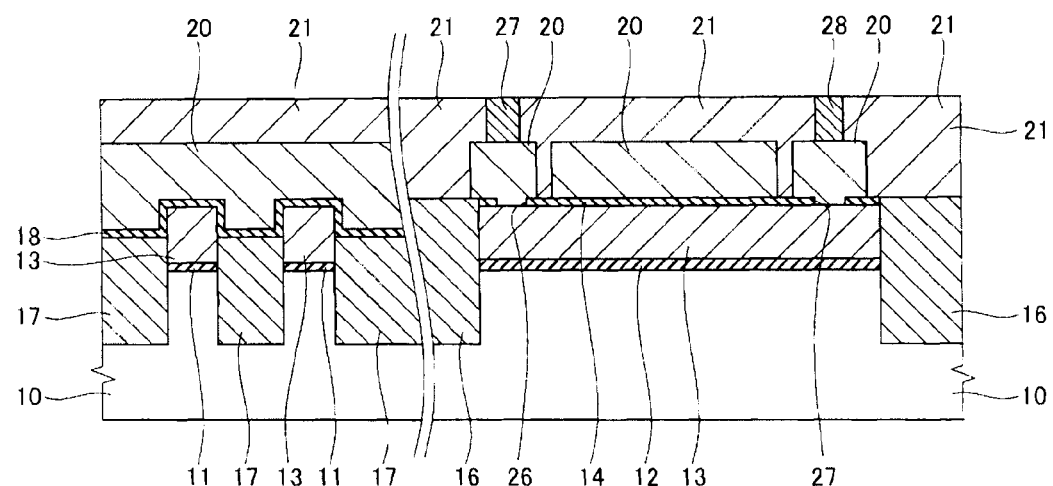
FIG. 12 is a cross-sectional diagram of the semiconductor memory device related to an embodiment for performing a comparison with a first embodiment.

FIG. 12 is a cross-sectional view of one example of the semiconductor memory device related to an embodiment for performing a comparison with a first embodiment. When FIG. 12 is compared with FIG. 11 which is a cross-sectional view of the semiconductor memory device related to the first embodiment of the present invention, two openings exist in the second insulation film 14 and the second conductor 20 exists above each of these openings. This is common to both views. However, in the structure shown in FIG. 12, the second conductor 20 of the peripheral circuit region is separated into three parts. That is, a first part, a second part above each of the two openings 26, 27, and a third part which is the second conductor 20 which has comparatively smaller length. Here, the phrase "comparatively small length" means small length when compared to the second conductor 20. Contacts 27, 28 are arranged to the left and right of the semiconductor 20 which has a small length. As a result, there is less room than in FIG. 11 for changing the positions of the openings 26, 27. Consequently, if the resistance value per unit length with the first conductor 13 is changed, the intervals between contacts have to be changed, and the density of wiring around the contact 27, 28 is large, then a change in the interval between the contact 27 and the contact 28 has an effect on other parts. Therefore, with the structure shown in FIG. 12 it is difficult to make changes between contacts.

Figure 13:
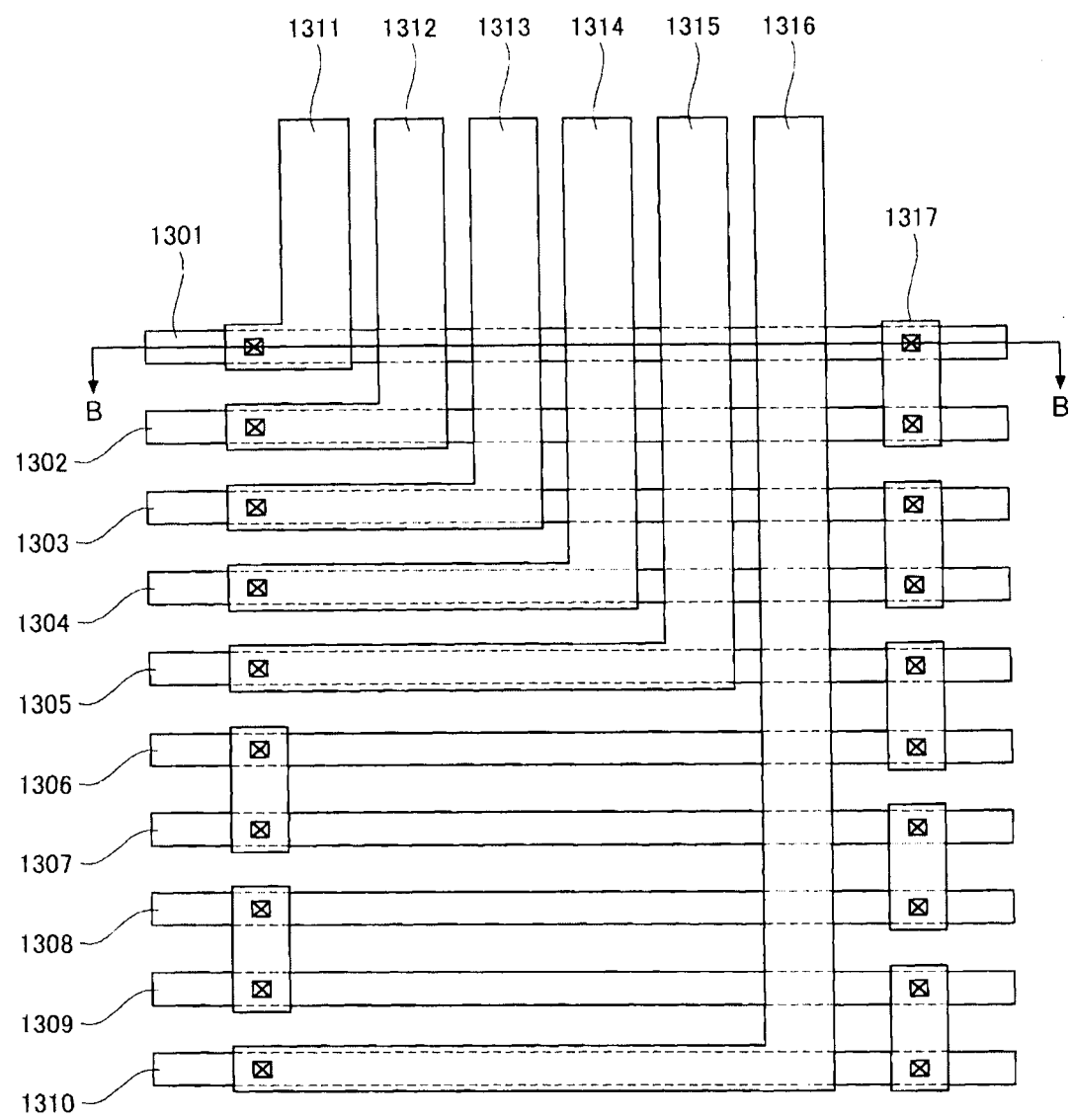
FIG. 13 is a planar view of one example of a resistance element and upper layer wiring.

FIG. 13 shows an example of the difficulty of changing intervals between contacts. FIG. 13 is a planar view of the peripheral circuit region. Resistance elements 1301-1310 are arranged in parallel on the lowest layer. Then, each resistance element includes a contact at each end. The wiring 1311 is connected to one contact of the resistance element 1301 and the wiring 1312 is connected to one contact of the resistance element 1302. A contact which is not connected with the wiring 1311 among the contacts of the resistance element 1301, and a contact which is not connected with the wiring 1312 among the contacts of the resistance element 1302, are connected by the wiring 1317. In this way, when the resistance value between contacts of one resistance element is R, the resistance value between the wiring 1311 and the wiring 1312 becomes 2×R. Similarly, the wiring 1313 is connected to one contact of the resistance element 1303, the wiring 1314 is connected to one contact of the resistance element 1304, one contact which is not connected to the wiring 1313 among the contacts of the resistance element 1303 and one contact which is not connected to the wiring 1314 among the contacts of the resistance element 1304 are connected by a wiring and the resistance between the wirings 1313 and 1314 becomes 2×R. In addition, the wiring 1315 is connected to one contact of the resistance element 1305, the wiring 1316 is connected to one contact of the resistance element 1310 and the contacts of the resistance elements 1305 to 1310 are connected so that the electrical resistance between the wiring 1315 and the wiring 1316 becomes 6×R.

Figure 14:
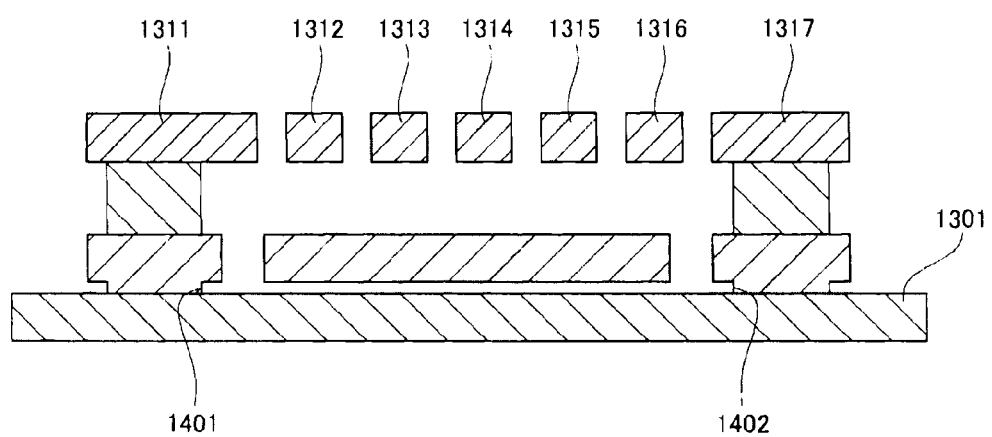
FIG. 14 is a cross-sectional view of one example of a resistance element and upper layer wiring.

FIG. 14 is a cross-sectional view taken along a cutting-plane line B-B in FIG. 13. As is shown in FIG. 14, the openings 1401 and 1402 are arranged corresponding to both ends of the resistance element 1301 on the lowest layer, and a conductor equivalent to the second conductor 20 exists above this, a contact is arranged above each of these and the wirings 1311 and 1317 are arranged above this. Then, wirings 1312, 1313, 1314, 1315, and 1316 are arranged between the wirings 1311 and the wiring 1317.

In the case where the resistance value per unit length of a material of the resistance element 1301 becomes larger due to a design change, it is necessary to reduce the distance between the openings 1401 and 1402 in order to maintain the resistance of the resistance element 1301. However, reducing the distance between the openings 1401 and 1402 makes reducing the distance between the wirings 1311 and 1317 necessary and in some cases reducing the room to pass the wirings 1312, 1313, 1314, 1315, and 1316, so that it becomes necessary to go around. Consequently, there are cases in which significant changes in design of wiring layers is necessary.

Figure 15:
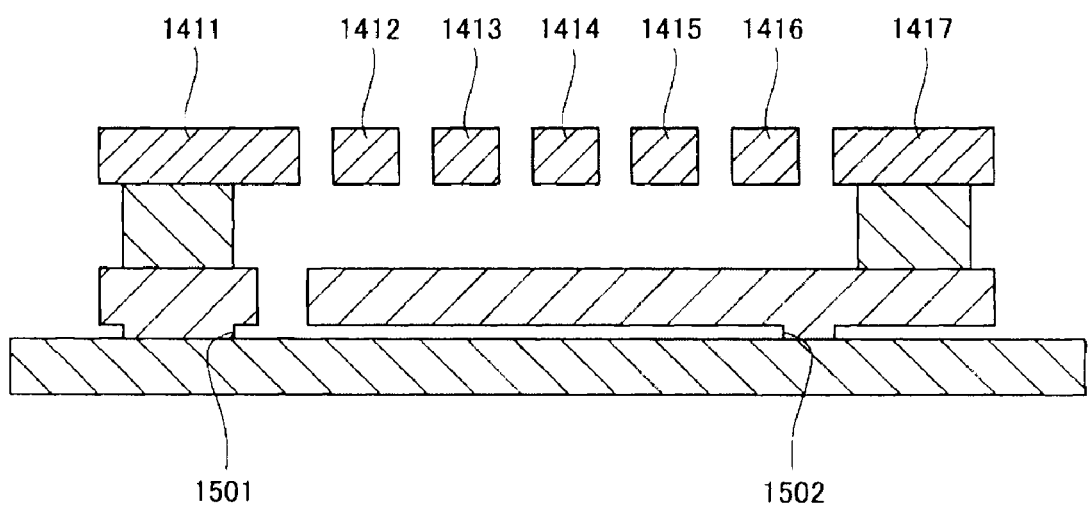
FIG. 15 is cross-sectional view of one example of a resistance element and upper layer wiring used in the first embodiment of the present invention.

However, FIG. 15 is a cross sectional view taken along a cutting-plane line B-B in FIG. 13 in the case where the first embodiment of the present invention is used. As is shown in FIG. 15, openings 1501 and 1502 exist above the resistance element 1301. As is shown in FIG. 15, the amount of freedom to arrange the opening 1502 is greater than the opening 1402 in FIG. 14. As a result, even if the resistance value per unit length of a material of the resistance element 1301 is changed due to changes in design, it is possible to maintain the resistance value between the wiring 1411 and wiring 1417 by moving the position of the opening 1502 and it is no longer necessary to correct the wiring layer.

As stated above, according to one embodiment of the present invention, a semiconductor memory device is provided which includes a resistance element having a structure in which if the position of a first opening of a second insulation film which exists on a different layer to that of a wiring, is changed, it is possible to maintain a resistance value between a first contact and a second contact.

What is claimed is:
1. A semiconductor memory device comprising:
 a resistance element including:
  a first conductor which extends in a first direction, is formed on a first insulation film above a semiconductor substrate, and is connected to a first contact;
  a second conductor which extends in said first direction and which is connected to a second contact; and
  a second insulation film which exists between said first conductor and said second conductor, said second insulation film also including an opening in which a third conductor which connects said first conductor and said second conductor is arranged; and
 a memory element including:
  a floating gate formed above a third insulation film, said third insulation film being formed above said semiconductor substrate, said floating gate being formed from the same material as said first conductor, said floating gate being covered by said first insulation film; and
  a control gate which is formed from the same material as said second conductor, said control gate being formed above said floating gate.

2. The semiconductor memory device according to claim 1, wherein a value of electrical resistance between said first contact and said second contact is determined by the position of said third conductor.

3. The semiconductor memory device according to claim 1, wherein said first conductor is connected to said first contact with a first connection part on said first conductor, said second conductor is connected to said second contact with a second connection part of said second conductor, and said third conductor is positioned on an opposite side of said first connection part with respect to said second connection part.

4. The semiconductor memory device according to claim 1, wherein said first contact and said second contact are formed in parallel and also formed in a perpendicular direction to said first direction.

5. The semiconductor memory device according to claim 1, wherein said opening is formed in a perpendicular direction to said first direction.

6. The semiconductor memory device according to claim 1, wherein a thickness of said first insulation film is larger than a thickness of said third insulation film.

7. The semiconductor memory device according to claim 1, wherein said first conductor is connected to said first contact with a first connection part on said first conductor, said second conductor is connected to said second contact with a second connection part of said second conductor, and said third conductor is positioned between said first connection part and said second connection part.

8. The semiconductor memory device according to claim 7, wherein said second insulation film includes a second opening and said first connection part includes a fourth conductor arranged in said second opening and a fifth conductor on said fourth conductor.

9. The semiconductor memory device according to claim 8, wherein said fifth conductor is formed from the same material as said second conductor.

10. A semiconductor memory device comprising:
a resistance element including:
a first conductor which extends in a first direction and is connected to a first contact with a first connection part on said first conductor;
a second conductor which extends in said first direction and is connected to a second contact with a second connection part of said second conductor; and
a first insulation film which exists between said first conductor and said second conductor, said first insulation film also including an opening in which a third conductor which connects said first conductor and said second conductor is arranged between said first connection part and said second connection part.

11. The semiconductor memory device according to claim 10, wherein
a value of electrical resistance between said first contact and said second contact is determined by the position of said third conductor.

12. The semiconductor memory device according to claim 1, wherein said second insulation film includes a second opening and said first connection part includes a fourth conductor arranged in said second opening and a fifth conductor on said fourth conductor.

13. The semiconductor memory device according to claim 12, wherein said fifth conductor is formed from the same material as said second conductor.

14. A semiconductor memory device comprising:
a resistance element including:
a first insulation film formed above a semiconductor substrate;
a first conductor which is formed above said first insulation film, said first conductor extending in a first direction;
a second insulation film which is formed above said first conductor;
a first opening which passes through said second insulation film, said first opening being formed from a conducting material;
a second conductor which is formed above said second insulation film, said second conductor extending in said first direction and being electrically connected with said first conductor by said conducting material of said first opening;
a third insulation film which is formed above said second conductor;
a first contact which passes through said third insulation film and said second insulation film, said first contact being connected with said first conductor, said first contact being electrically connected with said second conductor via said conducting material of said first opening; and
a second contact which passes through said third insulation film, said second contact being connected to said second conductor; and
a memory element including:
a floating gate which is formed above a fourth insulation film, said fourth insulation film being formed above said substrate, said floating gate being formed from the same material as said first conductor;
a fifth insulation film which is formed above said floating gate; and
a control gate which is formed above said fifth insulation film.

15. The semiconductor memory device according to claim 14, wherein a value of electrical resistance between said first contact and said second contact is determined by the position of said first opening.

16. The semiconductor memory device according to claim 14, wherein said first contact is connected to said first conductor at a first connection part, said second contact is connected to said second conductor at a second connection part, and said first opening is positioned between said first connection part and said second connection part.

17. The semiconductor memory device according to claim 14, wherein said first contact is connected to said first conductor at a first connection part, said second contact is connected to said second conductor at a second connection part, and said first opening is positioned on an opposite side of said first connection part with respect to said second connection part.

18. The semiconductor memory device according to claim 14, wherein a part or all of said control gate is formed from the same material as said second conductor.

19. The semiconductor memory device according to claim 14, wherein a thickness of said first insulation film is larger than a thickness of said fourth insulation film.

20. A semiconductor memory device comprising:
a resistance element including:
a first insulation film;
a first conductor which is formed above said first insulation film, said first conductor extending in a first direction;
a second insulation film which is formed above said first conductor;
a first opening which passes through said second insulation film, said first opening being formed from a conducting material;
a second conductor which is formed above said second insulation film, said second conductor extending in said first direction and being electrically connected with said first conductor by said conducting material of said first opening;
a third insulation film which is formed above said second conductor;
a first contact which passes through said third insulation film and said second insulation film, said first contact being connected with said first conductor at a first connection part of said first conductor, said first contact being electrically connected with said second conductor via said conducting material of said first opening; and
a second contact which passes through said third insulation film, said second contact being connected to said second conductor at a second connection part of said second conductor, said first opening being positioned between said first connection part and said second connection part.

21. A semiconductor memory device comprising:
a plurality of resistance elements arranged in a first direction, each resistance elements including:
   a first conductor which extends in a second direction perpendicular to said first direction and is connected to a first contact with a first connection part on said first conductor;
   a second conductor which extends in said second direction and is connected to a second contact with a second connection part of said second conductor; and
   a first insulation film which exists between said first conductor and said second conductor, said first insulation film also including an opening in which a third conductor which connects said first conductor and said second conductor is arranged between said first connection part and said second connection part; and
a plurality of wirings, each wiring connecting first contacts or second contacts of adjacent resistance elements.

22. The semiconductor memory device according to claim 21, further comprising a plurality of wirings, said plurality of wirings being arranged in parallel between said first contacts and said second contact.

23. The semiconductor memory device according to claim 22, wherein said plurality of wirings are arranged in said second direction.

24. A semiconductor memory device comprising:
a resistance element including:
   a first insulation film formed above a semiconductor substrate;
   a first conductor which is formed above said first insulation film, said first conductor extending in a first direction;
   a second insulation film which is formed above said first conductor;
   a first opening which passes through said second insulation film, said first opening being formed from a conducting material;
   a second opening which passes through said second insulation film, said second opening being formed from a conducting material;
   a second conductor which is formed above said second insulation film, said second conductor extending in said first direction and being electrically connected with said first conductor by said conducting material of said first opening;
   a third conductor which is formed above said second insulation film, said third conductor being electrically connected with said first conductor by said conducting material of said second opening;
   a third insulation film which is formed above said second conductor;
   a first contact which passes through said third insulation film, said first contact being connected with said third conductor, said first contact being electrically connected with said second conductor via said conducting material of said second opening and said conducting material of said first opening; and
   a second contact which passes through said third insulation film, said second contact being connected to said second conductor; and
a memory element including:
   a floating gate which is formed above a fourth insulation film, said fourth insulation film being formed above said substrate, said floating gate being formed from the same material as said first conductor;
   a fifth insulation film which is formed above said floating gate; and
   a control gate which is formed above said fifth insulation film.

25. The semiconductor memory device according to claim 24, wherein a value of electrical resistance between said first contact and said second contact is determined by the position of said first opening.

26. A semiconductor memory device comprising:
a resistance element including:
   a first insulation film formed above a semiconductor substrate;
   a first conductor which is formed above said first insulation film, said first conductor extending in a first direction;
   a second insulation film which is formed above said first conductor;
   a first opening which passes through said second insulation film, said first opening being formed from a conducting material;
   a second opening which passes through said second insulation film, said second opening being formed from a conducting material;
   a second conductor which is formed above said second insulation film, said second conductor extending in said first direction and being electrically connected with said first conductor by said conducting material of said first opening;
   a third conductor which is formed above said second insulation film, said third conductor being electrically connected with said first conductor by said conducting material of said second opening;
   a third insulation film which is formed above said second conductor;
   a first contact which passes through said third insulation film, said first contact being connected with said third conductor, said first contact being electrically connected with said second conductor via said conducting material of said second opening and said conducting material of said first opening; and
   a second contact which passes through said third insulation film, said second contact being connected to said second conductor on an opposite side of said second opening with respect to said first opening.

27. The semiconductor memory device according to claim 26, wherein a value of electrical resistance between said first contact and said second contact is determined by the position of said first opening.

* * * * *